US00RE36123E

United States Patent [19]

Scarráet al.

[11] E Patent Number: Re. 36,123

[45] Reissued Date of Patent: Mar. 2, 1999

[54] CIRCUIT FOR THE GENERATION OF A SCANNING CLOCK IN AN OPERATIONAL ANALYSIS DEVICE OF THE SERIAL TYPE FOR AN INTEGRATED CIRCUIT

[75] Inventors: Flavio Scarrá, San Diego, Calif.; Maurizio Gaibotti, Cesano Madero; Giampiero Trupia, Carnate, both of Italy

[73] Assignee: SGS-Thomson Microelectronics S.r.L., Agrate Brianza, Italy

[21] Appl. No.: 492,462

[22] Filed: Jun. 15, 1995

Related U.S. Patent Documents

Reissue of:

[64] Patent No.: 5,220,217
Issued: Jun. 15, 1993
Appl. No.: 812,135
Filed: Dec. 18, 1991

[30] Foreign Application Priority Data

Dec. 19, 1990 [IT] Italy ..... 22437 A/90

[51] Int. Cl.[6] ..... H03K 19/096

[52] U.S. Cl. ..... 327/295; 326/93

[58] Field of Search ..... 326/93, 96, 97, 326/98; 327/141, 295; 371/22.1, 22.3

[56] References Cited

U.S. PATENT DOCUMENTS

| | | | |
|---|---|---|---|
| 4,245,349 | 1/1981 | Kumaoka et al. | 455/165.1 |
| 4,308,472 | 12/1981 | McLaughlin | 327/18 |
| 4,441,182 | 4/1984 | Best et al. | 371/22.1 |
| 4,493,077 | 1/1985 | Agrawal et al. | 371/22.3 |
| 4,613,773 | 9/1986 | Koike | 326/97 |
| 4,627,085 | 12/1986 | Yuen | 326/51 |
| 4,649,539 | 3/1987 | Crain et al. | 371/22.3 |
| 4,701,920 | 10/1987 | Resnick et al. | 371/22.3 |
| 4,710,933 | 12/1987 | Powell et al. | 371/25 |
| 4,922,138 | 5/1990 | Hashimoto et al. | 326/97 |
| 5,045,776 | 9/1991 | Claridge | 324/73.1 |
| 5,225,724 | 7/1993 | Scarrá et al. | 326/16 |

FOREIGN PATENT DOCUMENTS

| | | |
|---|---|---|
| 3 106 183 | 9/1982 | Germany . |
| 2 188 504 | 9/1987 | United Kingdom . |
| 2 192 106 | 12/1987 | United Kingdom . |

OTHER PUBLICATIONS

"LSSD Compatible Non–Overlapping Clock Splitter," *IBM Technical Bulletin*, vol. 31, No. 4: Sep. 1988.

*Primary Examiner*—Edward P. Westin
*Assistant Examiner*—Richard Roseen
*Attorney, Agent, or Firm*—David V. Carlson; Bryan A. Santarelli; Seed and Berry LLP

[57] ABSTRACT

The circuit comprises a first switching circuit which receives at an input a system clock normally provided for the operation of the integrated circuit and produces at an output a machine clock normally coincident with the system clock, circuitry for clamping the first switching circuit responsive to a firing signal of the serial operational analysis device determines which state the machine clock is clamped in and second switching circuit which receives at an input the system clock and is responsive to the firing signal to produce a scanning clock which repeats the system clock in an inverted or non-inverted manner according to the state in which the machine clock has been clamped.

37 Claims, 2 Drawing Sheets

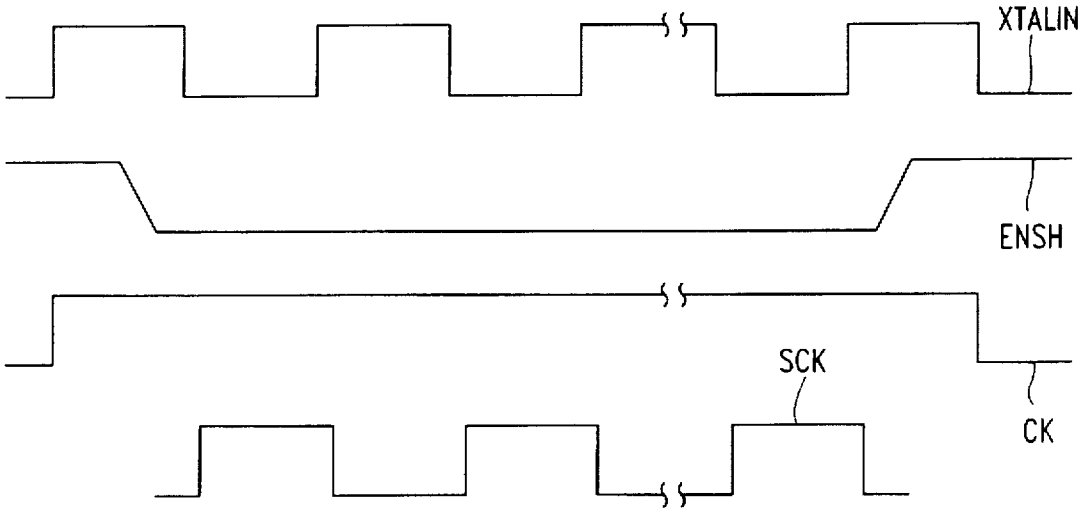
*Fig. 2*
(AMENDED)
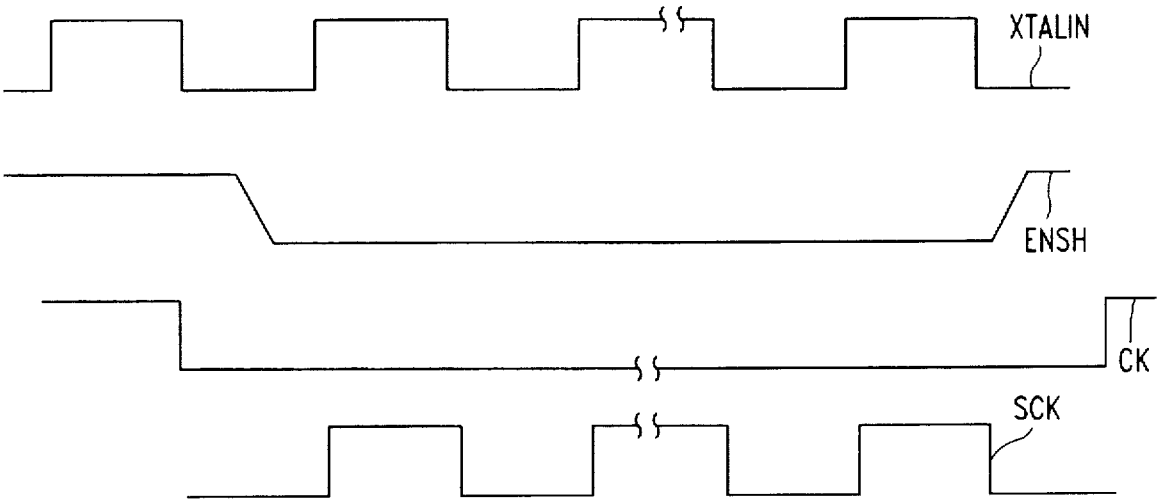
*Fig. 3*
(AMENDED)

CIRCUIT FOR THE GENERATION OF A SCANNING CLOCK IN AN OPERATIONAL ANALYSIS DEVICE OF THE SERIAL TYPE FOR AN INTEGRATED CIRCUIT

Matter enclosed in heavy brackets [ ] appears in the original patent but forms no part of this reissue specification; matter printed in italics indicates the additions made by reissue.

DESCRIPTION

1. Technical Field

The present invention relates to a circuit for the generation of a scanning clock in an operational analysis device of the serial type for an integrated circuit, otherwise known as a scan path.

2. Background of the Invention

As described in the Italian patent application No. 21820 A/90 dated 22 Oct. 1990 filed in the name of the same applicant, the so-called scan path is a type of analysis that is widely used in checking whether one or more functional blocks of an integrated circuit, such as, say, a microprocessor, operate correctly.

It is based on the use of scanning signals of the serial type which act on chains of scanning cells (latches) located at the input and at the output of individual functional blocks with a function of stimulation and assessment, respectively, of the operational state of the blocks themselves.

In this way it is possible to progressively update the operational state of the functional block under examination and to obtain correspondingly at output a signal that is indicative of the different states assumed by the same functional block at each inquiry of the serial signal at input.

The most natural way to obtain these scanning signals is that of supplying them from the outside on additional pins of the integrated circuit to be analyzed.

This requires an increase in the normal number of pins of the integrated circuit with consequent greater structural complexity, increase in cost and departure from the concept of product standardization.

SUMMARY OF THE INVENTION

The object of the present invention is to accomplish a circuit that allows such scanning signals to be obtained without adding further pins beyond those already normally provided for the operation of the integrated circuit.

These and other objects are accomplished according to the invention by a circuit that comprises first switching means which receive at input a system clock normally provided for the operation of the integrated circuit and produce at output a machine clock normally coincident with said system clock, means for clamping said first switching means which after a firing signal of the serial analysis determines the clamping of the state of the machine clock and second switching means which receives at an input said system clock and is fired by said firing signal to produce a scanning clock which repeats the system clock in an inverted or non-inverted manner according to the state in which the machine clock has been clamped.

In this way no additional pin is required and the scanning clock can simply be obtained from the system clock already in the integrated circuit.

According to a possible embodiment of the present invention, said first switching means comprises a first and a second amplifier stage of the system clock at input, each followed by a respective inverting stage, and said clamping means is constituted by a switching stage operated by the trailing edge of said firing signal of the serial analysis to evolve from a closed position suitable for allowing the passage through it of the system clock for the generation of the machine clock and an open position in which said clamping of the state of the machine clock takes place.

In addition, between the output of said switching stage and the input of said second amplifier stage there is a feedback stage suitable for preventing the production of spurious signals during the switching operation of said switching stage to the open position.

Lastly, between the output of the second amplifier stage and the input of said switching stage there is a latch circuit which during the switching operation of said switching stage to the open position prevents the second amplifier stage from going into oscillation giving rise to energy losses.

The features of the present invention shall be made more evident by an embodiment illustrated as a nonlimiting example in the enclosed drawings.

BRIEF DESCRIPTION OF THE DRAWINGS

FIGS. 2 and 3 illustrate different waveforms of the signals through the circuit.

DETAILED DESCRIPTION OF THE INVENTION

Figure 1:
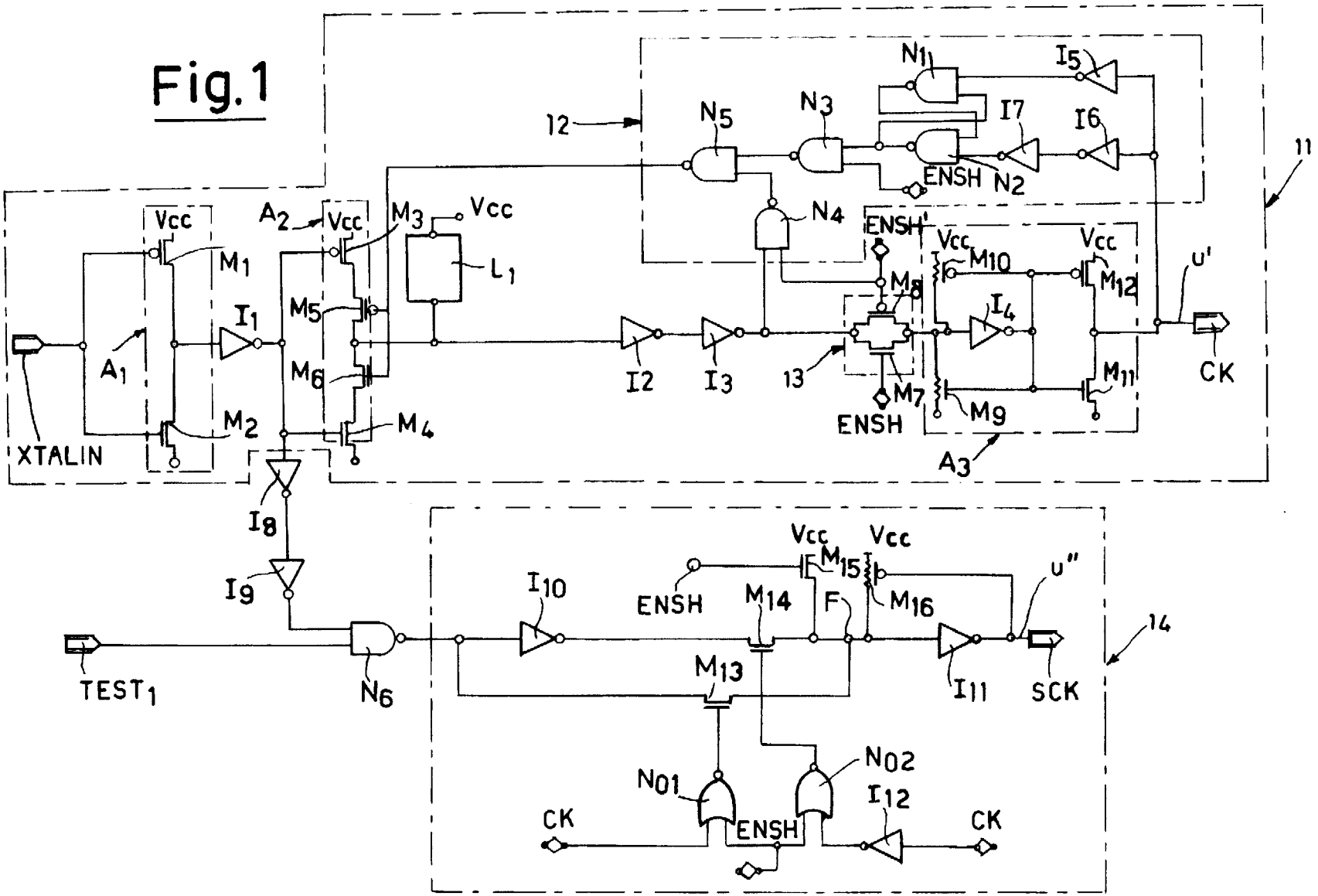
FIG. 1 is an example of an embodiment of the circuit according to the invention.

With reference to FIG. 1, the circuit comprises first switching means 11, which comprises in turn a first amplifier stage A1 constituted by a series of a p-channel transistor M1 and an n-channel transistor M2. The gates of the transistors M1 and M2 are connected together and supplied with an input signal XTALIN which is the system clock already normally provided for the operation of the integrated circuit. The source of the transistor M1 is at a voltage Vcc and the drain is connected to the drain of the transistor M2. The source of the transistor M2 is grounded.

The input of an inverter I1 is connected between the drain of the transistor M1 and the drain of the transistor M2. The output of the inverter I1 is connected to the gates of two p-channel and n-channel transistors M3, M4, respectively, forming part of a second amplifier stage A2 which, in series with them, comprises a p-channel transistor M5 and an n-channel transistor M6. The source of the transistor M3 is at a voltage Vcc and the drain is connected to the source of the transistor M5. The drain of the transistor M5 is connected to the drain of the transistor M6 and the source of the transistor M6 is connected to the drain of the transistor M4; in addition, the source of the transistor M4 is grounded. The gates of the transistors M5 and M6 are connected to the output of a feedback stage 12 whose objects shall be explained later.

Between the drain of the transistor M5 and the drain of the transistor M6 there is connected the input of a second inverter I2 whose output represents the input of a third inverter I3. The output of the third inverter I3 represents the input of a switching stage 13, which operates as a clamping means for the first switching means 11 and comprises an n-channel transistor M7 and a p-channel transistor M8 arranged in parallel to one another. The gate of the transistor M7 is controlled by a firing signal of the serial analysis, or scan path analysis, ENSH, while the gate of the transistor M8 is controlled by a signal ENSH' which is complementary to the signal ENSH.

The output of the switching stage M7, M8 represents the input of a third amplifier stage A3 at whose output the machine clock CK is taken. Said third amplifier stage A3 comprises the series of two n-channel and p-channel resistive transistors M9, M10, respectively, an inverter I4 and another series of two n-channel and p-channel resistive transistors M11, M12, respectively, connected in parallel with the transistors M9 and M10. The source of the transistor M10 is at a voltage Vcc and the drain of the same is connected to the drain of the transistor M9, whose source is grounded. The input of the inverter I4 is connected between the drain of the transistor M10 and the drain of the transistor M9. The output of the inverter I4 is connected to the interconnected gates of the transistors M10, M9, M12, M11. The source of the transistor M12 is at a voltage Vcc and the drain is connected to the drain of the transistor M11, whose source is grounded. An output U' of the first switching means 11, on which a machine clock CK is made available, is connected between the drain of the transistor M12 and the drain of the transistor M11.

To the output of the inverter I3 and to the terminal ENSH' there are connected as many inputs of a logic gate NAND N4 included in the feedback stage 12. The latter also comprises an inverter I5, whose input is connected to the output of the amplifier stage A3 and whose output is connected to an input of a logic gate NAND N1, whose output is connected to an input of a logic gate NAND N2, at whose other input there is connected the output of a series of inverters I6, I7 supplied at input with the machine clock CK. The other input of the logic gate N1 is connected to the output of the logic gate N2. The output of the logic gate NAND N2 represents one of the two inputs of a logic gate NAND N3 whose other input is supplied with the signal ENSH. The output of the logic gate N3 and the output of the logic gate N4 represent the inputs of a logic gate NAND N5. The output of the logic gate N5, which represents the output of the feedback stage 12, is connected to the gates of the transistors M5 and M6 present in the second amplifier stage A2.

A latch circuit L1, biased with a voltage Vcc, is connected to the input of the inverter I2.

The output of the inverter I1 is connected through two inverters I8, I9 to the input of a logic gate NAND N6. The other input of the logic gate N6 is supplied with a serial test setting signal TEST1.

The output of the logic gate N6 represents the input of second switching means 14, which comprise transistors M13, M14. The drains of the transistors M13, M14 are connected to the output of the logic gate N6 directly and through an inverter I10, respectively, while the sources are connected at a common node F to the input of an inverter I11, across whose output U" the scanning signal SCK is taken.

The gates of the transistors M13, M14 are operated by the outputs of logic NOR gates, NO1, NO2. The inputs of the logic gate NO1 are supplied with the machine clock CK and with the firing signal ENSH, respectively, while the inputs of the logic gate NO2 are supplied with the signal ENSH and, through an inverter I12, with the machine clock CK.

The drain of a pull-up transistor M15 is connected to the source of a transistor M14. The gate of the transistor M15 is operated by the signal ENSH and the source is connected to the voltage Vcc.

The drain of the resistive transistor M16 is connected to the input of the inverter I11. The source of the transistor M16 is connected to the voltage Vcc and the gate to the output U".

As is better illustrated in detail in FIGS. 2 and 3, with reference to the circuit arrangement described in detail above, as long as the firing signal of the serial analysis ENSH is at a logic level 1 the switching stage M7, M8 is in the closed position.

The input signal XTALIN, after passing through the first amplifier stage A1 and the subsequent inverter I1, the second amplifier stage A2 and the subsequent inverters I1, I3, can pass through the switching stage M7, M8 and then be sent through the amplifier stage A3 to the output U' of the first switching means 11 to be taken as a machine clock CK, which repeats the oscillations of the system clock XTALIN.

Let us now suppose that a serial test setting signal TEST1, suitable for preparing the circuit for the scan path operation, is produced across the corresponding input of the logic gate N6, so that at the output from the latter, up to now clamped at the logic level 1, there is an inverted signal XTALIN.

Let us also suppose that under this condition the firing signal of the serial analysis ENSH, normally at the logic level 1, is taken to the logic level 0, and consequently ENSH' is taken to the logic level 1. This causes the opening of the switching stage 13, which clamps the oscillation of the signal of the machine clock CK.

If, at that instant, the machine clock is in the condition illustrated in FIG. 2, that is, in the high position, or in the condition illustrated in FIG. 3, that is, in the low position, it shall be clamped in its respective state. Under this condition the latch circuit L1 prevents the production of oscillations of the amplifier A2 with consequent energy losses.

Simultaneously, through the feedback stage 12 the transistors M5 and M6 are switched off with the object of saving energy and of avoiding spurious signals.

With the firing signal ENSH of the serial analysis at a low level and the machine clock CK clamped either at a high level (FIG. 2) or at a low level (FIG. 3) the NOR gates, NO1 and NO2 of the second switching means 14 cause the transistors M13 and M14 to transfer to the output U", in an inverted or in a direct manner, the signal XTALIN at the output of the gate NAND N6.

In this way a scanning clock SCK shall be available at the output U" of the circuit, which, as highlighted by the corresponding curves of FIGS. 2 and 3, repeats with a given delay, the system clock XTALIN in [non-inverted or in an inverted manner] *an inverted or in a noninverted manner*, respectively.

It can be seen from FIGS. 2 and 3 that the scanning clock SCK is suitable for locking onto the first edge of the system clock XTALIN so that under all conditions the first edge is a leading edge. This depends on the fact that SCK, being destined to be used for the direct control of the passage of the data from the master part to the slave part of the scanning cells, as described in the previous Italian patent application No. 21820 A/90, during normal operation of the system is stably at the logic level 0.

What is claimed is:

1. A circuit for the generation of a scanning clock in a serial operational analysis device for an integrated circuit, comprising a first switching means which receives at an input a system clock normally provided for the operation of the integrated circuit and produces at an output a machine clock normally coincident with said system clock, means for clamping said first switching means responsive to a firing signal of said serial operational analysis device which determines the clamping of the state of the machine clock and second switching means which receives at its input said system clock and is responsive to said firing signal to produce a scanning clock which repeats the system clock in an inverted or non-inverted manner according to the state in which the machine clock has been clamped.

2. A circuit according to claim 1, wherein said first switching means comprises a first and a second amplifier stage with inputs coupled to receive the system clock, each followed by a respective inverter stage, and said clamping means is comprised of a switching stage, operated by the trailing edge of said firing signal of the serial operational analysis device which sets said switching stage in a closed position for allowing the passage through it to the system clock for the generation of the machine clock and is further responsive to the leading edge of said firing signal of the serial operational analysis device which sets said switching stage in an open position in which clamping of the state of the machine clock takes place.

3. A circuit according to claim 2, further comprising a feedback stage coupled between the output of said switching stage and the input of said second amplifier stage wherein said feedback stage prevents the production of spurious signals during the switching operation of said switching stage to the open position.

4. A circuit according to claim 2, further comprising a latch circuit coupled between the output of said second amplifier stage and the input of said switching stage which during the switching operation of said switching stage to the open position prevents the second amplifier stage from going into oscillation which would give rise to energy losses.

*5. A circuit for generating a scanning clock, comprising:*

*a first switch circuit operable to receive a system clock and a firing signal, said first switch circuit operable to generate a machine clock when said firing signal is in a first firing state and to clamp said machine clock in a first or second machine state when said firing signal is in a second firing state; and*

*a second switch circuit operable to receive said system clock, said firing signal, and said machine clock, said second switch circuit operable to generate said scanning clock when said firing signal is in said second firing state, said scanning clock substantially noninverted with respect to said system clock when said machine clock is in said first machine state and substantially inverted with respect to said system clock when said machine clock is in said second machine state.*

*6. The circuit of claim 5 wherein said first switch circuit comprises a switching stage operable to receive said system clock and said firing signal, and to close and open when said firing signal is in said first and second firing states respectively.*

*7. The circuit of claim 5 wherein said first switch circuit comprises a switching stage operable to receive said system clock, to receive said firing signal, and to close when said firing signal is in said first firing state and to open when said firing signal is in said second firing state.*

*8. The circuit of claim 7 wherein said first switch circuit further comprises an amplifier operable to receive an output clock from said switching stage and to generate said machine clock from said output clock.*

*9. The circuit of claim 7 wherein said first switch circuit further comprises one or more serially coupled amplifiers interposed between said system clock and said switching stage.*

*10. The circuit of claim 5 wherein said second switch circuit comprises:*

*a first path operable to receive and invert said system clock to generate said scanning clock when said firing signal is in said second firing state and said machine clock is in said second machine state; and*

*a second path operable to receive and pass through said system clock to generate said scanning clock when said firing signal is in said second firing state and said machine clock is in said first machine state.*

*11. The circuit of claim 10 wherein said second switch circuit comprises:*

*a first switch serially coupled to said first path;*

*a second switch serially coupled to said second path;*

*a first enable circuit operable to close said first switch when said firing signal is in a second firing state and said machine clock is clamped in said second machine state; and*

*a second enable circuit operable to close said second switch when said firing signal is in a second firing state and said machine clock is clamped in said first machine state.*

*12. The circuit of claim 5 wherein said first switch circuit further comprises a feed back circuit operable to uncouple said system clock from said first switch circuit when said firing signal is in said second firing state.*

*13. A circuit, comprising:*

*a first circuit for generating a machine clock from a system clock, said first circuit including,*

*an input terminal coupled to receive said system clock,*

*an output terminal that provides said machine clock,*

*a switching stage having input and output terminals, and having a control terminal coupled to receive a firing signal that closes and opens said stage when in a first and a second state respectively,*

*one or more amplifier stages each having input and output terminals and serially coupled between said input terminals of said first circuit and said switching stage, and*

*a latching stage coupled between said output terminals of said switching stage and said first circuit; and*

*a second circuit for generating a scanning clock from said system clock, said second circuit including,*

*an input terminal coupled to receive said system clock,*

*an output terminal that provides said scanning clock,*

*a first path coupled between said input and output terminals of said second circuit, said first path including a first switch having a control terminal,*

*a second path coupled between said input and output terminals of said second circuit, said second path including a second switch having a control terminal,*

*a first enable circuit having a first input terminal coupled to said output terminal of said first circuit, a second input terminal coupled to receive said firing signal, and an output terminal coupled to said control terminal of said first switch, and*

*a second enable circuit having a first input terminal coupled to said output terminal of said first circuit, a second input terminal coupled to receive said firing signal, and an output terminal coupled to said control terminal of said second switch.*

*14. The circuit of claim 13 wherein one or more of said amplifier stages comprise inverters.*

*15. The circuit of claim 13 further comprising:*

*a test terminal that receives a test signal; and*

*a third enable circuit interposed between said system clock and said input terminal of said second circuit, said third enable circuit including a first input terminal coupled to said test terminal, a second input terminal coupled to receive said system clock, and an output terminal coupled to said input terminal of said second circuit.*

*16. The circuit of claim 13 wherein said third enable circuit comprises a NAND gate.*

*17. The circuit of claim 13 wherein said second path includes an odd number of inverters serially coupled to said second switch.*

*18. The circuit of claim 13 wherein said first and second enable circuits each comprise a NOR gate.*

*19. The circuit of claim 18 wherein said first enable circuit comprises an inverter coupled between said first input terminal of said first enable circuit gate and a corresponding input terminal of said NOR gate.*

*20. The circuit of claim 13 wherein said input terminal of said second circuit is coupled to an output of one of said amplifier stages.*

*21. The circuit of claim 13 wherein said first circuit further comprises a feed-back circuit coupled between said output terminal of said first circuit and a disable terminal of one of said amplifier stages.*

*22. A method for generating a scanning clock, comprising:*

*generating a machine clock from a system clock when a firing signal is in a first firing state;*

*clamping said machine clock in a first or second machine-clock state when said firing signal is in a second firing state;*

*generating said scanning clock substantially coincident with said system clock when said machine clock is clamped in said first machine-clock state; and*

*generating said scanning clock substantially inverted with respect to said system clock when said machine clock is clamped in said second machine-clock state.*

*23. The method of claim 22 wherein:*

*said generating a machine clock includes closing a switch that receives said system clock when said firing signal is in said first firing state; and*

*said clamping includes opening said switch when said firing signal is in said second firing state.*

*24. The method of claim 23 further comprising uncoupling said system clock from said switch when said firing signal is in said second firing state.*

*25. The method of claim 22 wherein:*

*said generating a machine clock includes closing a switch that receives said system clock when said firing signal is in said first firing state; and*

*said clamping includes opening said switch and latching said machine clock in its present state when said firing signal is in said second firing state.*

*26. The method of claim 22 wherein:*

*said generating a machine clock includes, when said firing signal is in said first firing state, coupling said system clock to an amplifier stage that generates said machine clock; and*

*said clamping includes uncoupling said system clock from said amplifier stage when said firing signal is in said second firing state.*

*27. The method of claim 22 wherein:*

*said generating a machine clock includes coupling said system clock to an amplifier stage when said firing signal is in said first firing state; and*

*said clamping includes, when said firing signal is in said second firing state, uncoupling said system clock from said amplifier stage and holding in said amplifier stage the state of said machine clock when said firing signal transitioned from said first to said second firing state.*

*28. An integrated circuit, comprising:*

*one or more functional blocks;*

*one or more serially coupled input chains operable to propagate an input scanning signal from an input of a first cell to an output of a last cell, each of said input chains coupled to an associated one of said blocks and a scanning clock;*

*one or more serially coupled output chains operable to propagate an output scanning signal from an input of a first cell to an output of a last cell, each of said output chains coupled to an associated one of said blocks and said scanning clock; and*

*a scanning-clock generator, including,*

*a first switch circuit having an input terminal operable to receive a system clock, an output terminal, and a control terminal operable to receive a firing signal, said first switch circuit operable to generate a machine clock on said output terminal when said firing signal is in a first firing state and to clamp said machine clock in a first or second machine state when said firing signal is in a second firing state; and*

*a second switch circuit having an input terminal operable to receive said system clock, a first control terminal operable to receive said firing signal, a second control terminal coupled to said output terminal of said first switch circuit, and an output terminal, said second switch circuit operable to generate said scanning clock on said output terminal when said firing signal is in said second firing state, said scanning clock substantially noninverted with respect to said system clock when said machine clock is in said first machine state and substantially inverted with respect to said system clock when said machine clock is in said second machine state.*

*29. The circuit of claim 28 wherein said first switch circuit further comprises a switching stage having control, input, and output terminals respectively coupled to said control, input, and output terminals of said first switch circuit, said switching stage operable to close and open when said firing signal is in said first and second firing states respectively.*

*30. The circuit of claim 29 wherein said first switch circuit further comprises one or more inverters interposed between said input terminals of said first switch circuit and said switching stage.*

*31. The circuit of claim 29 wherein said first switch circuit further comprises one or more amplifier stages interposed between said input terminals of said first switch circuit and said switching stage.*

*32. The circuit of claim 31 wherein said first switch circuit further comprises a feedback circuit coupled between said output terminal of said first switch circuit and a disable input of one of said amplifier stages.*

*33. The circuit of claim 30 wherein said first switch circuit further comprises a latch interposed between said output terminals of said switching stage and said first switch circuit.*

*34. The circuit of claim 28 wherein said second switch circuit further comprises:*

*a first path coupled between said input and output terminals of said second switch circuit and including a first switching stage having a control terminal;*

*a second path coupled between said input and output terminals of said second switch circuit and including a second switching stage having a control terminal;*

*a first enable circuit having input terminals coupled to said output terminal of said first switch circuit and to said firing signal respectively and having an output terminal coupled to said control terminal of said first switching stage; and*

*a second enable circuit having input terminals coupled to said output terminal of said first switch circuit and to said firing signal respectively, and having an output terminal coupled to said control terminal of said second switching stage.*

*35. The circuit of claim 34 wherein said second path includes an odd number of inverters in series with said second switching stage.*

*36. The circuit of claim 34 wherein said first and second enable circuits each comprise a NOR gate.*

*37. The circuit of claim 36 wherein said first enable circuit comprises an inverter coupled between an input terminal of said NOR gate and said input terminal of said first enable circuit that is coupled to said output terminal of said first switch circuit.*

* * * * *